United States Patent
Tahara et al.

(10) Patent No.: US 7,123,094 B2
(45) Date of Patent: Oct. 17, 2006

(54) HIGH FREQUENCY POWER AMPLIFIER CIRCUIT AND RADIO COMMUNICATION SYSTEM

(75) Inventors: Kenji Tahara, Komoro (JP); Takayuki Tsutsui, Saku (JP); Tetsuaki Adachi, Tobu (JP)

(73) Assignee: Renesas Technology Corp., Chiyoda-ku (JP)

( * ) Notice: Subject to any disclaimer, the term of this patent is extended or adjusted under 35 U.S.C. 154(b) by 38 days.

(21) Appl. No.: 10/821,935

(22) Filed: Apr. 12, 2004

(65) Prior Publication Data

US 2004/0263254 A1 Dec. 30, 2004

(30) Foreign Application Priority Data

Jun. 27, 2003 (JP) ............................. 2003-183696

(51) Int. Cl.
H03G 3/30 (2006.01)
(52) U.S. Cl. ...................... 330/285; 330/133; 330/134
(58) Field of Classification Search ................ 330/285, 330/133–134, 129, 278
See application file for complete search history.

(56) References Cited

U.S. PATENT DOCUMENTS

| | | | |
|---|---|---|---|
| 5,126,688 A * | 6/1992 | Nakanishi et al. | 330/285 |
| 6,172,567 B1 * | 1/2001 | Ueno et al. | 330/285 |
| 6,236,266 B1 * | 5/2001 | Choumei et al. | 330/133 |
| 6,701,138 B1 * | 3/2004 | Epperson et al. | 455/127.3 |
| 6,806,774 B1 * | 10/2004 | Sakuno | 330/296 |
| 6,882,220 B1 * | 4/2005 | Doherty et al. | 330/133 |

FOREIGN PATENT DOCUMENTS

JP  2000-151310  8/1999

* cited by examiner

*Primary Examiner*—Dinh T. Le
(74) *Attorney, Agent, or Firm*—Reed Smith LLP; Stanley P. Fisher, Esq.; Juan Carlos A. Marquez, Esq.

(57) ABSTRACT

Providing a high frequency power amplifier circuit and a radio communication system which can control output power by a power voltage, produce sufficient output power in high regions of demanded output power and improve power efficiency in low regions of demanded output power. In a high frequency power amplifier circuit (RF power module) which comprises two or more cascaded FETs for amplification and controls output power by controlling power voltages of the FETs for amplification to gate terminals of which bias voltages of a predetermined level are applied, different transistors for power voltage control are provided for a last-stage FET for amplification and preceding-stage FETs for amplification. The transistors for power voltage control generate and apply the power voltage so that the preceding-stage FETs for amplification saturate when a demanded output level is relatively low.

10 Claims, 7 Drawing Sheets

HIGH FREQUENCY POWER AMPLIFIER CIRCUIT AND RADIO COMMUNICATION SYSTEM

CROSS-REFERENCE TO RELATED APPLICATION

The present application claims priority from Japanese patent application JP 2003-183696 filed on Jun. 27, 2003, the content of which is hereby incorporated by reference into this application.

BACKGROUND OF THE INVENTION

The present invention relates to a technique effectively applied to a high frequency power amplifier circuit and a radio communication device such as a cellular phone incorporating the high frequency power amplifier circuit, and more particularly to a technique for improving an output power level and power efficiency in a high frequency power amplifier circuit capable of controlling the power voltages of amplification transistors making up the high frequency power amplifier circuit to control output power.

A high frequency power amplifier circuit (in general, configured in multiple stages) that uses semiconductor amplifying elements such as MOS FET (Field Effect Transistor) and GaAs-MESFET is built into an output part of a transmitting side of a radio communication device such as a cellular phone (mobile communication device).

In a high frequency power amplifier circuit of this kind, generally, a semiconductor chip including transistors for amplification, their bias circuits, a power voltage control circuit, and the like are mounted on an insulating substrate such as a ceramic substrate to the surface and inside of which printed wirings are made, along with other semiconductor chips and discrete parts such as capacitances. Since the parts are coupled by the printed wirings and bonding wires so as to perform their respective required functions, the high frequency power amplifier circuit operates as if it were one electronic part.

The abovementioned electronic part is called an RF power module. However, instead of configuring the high frequency power amplifier circuit with plural semiconductor chips and discrete parts, it may be configured with one semiconductor integrated circuit and some external parts. This specification refers to such a semiconductor integrated circuit and the abovementioned RF power module collectively as a high frequency power amplifier circuit.

Cellular phones control output power (transmission power) so as to match ambient environments according to power level specification information from base stations so that output power is increased when distant from the base stations, and output power is reduced when near the base stations. In this way, a system is configured to prevent interference with other cellular phones.

Conventionally, some RF power modules of transmission output stages in cellular phones of the GSM (Global System for Mobile Communication) system are provided with an APC (Automatic Power Controller) circuit (see Patent Publication 1, for example). The APC circuit controls output power required for calls by detecting a DC level of output by a coupler, comparing it with an output level specification signal (Vramp), and feeding the result back to a bias circuit for generating an input bias voltage (gate bias voltage) of an output power element. This system is called a closed loop system.

On the other hand, the present applicant previously applied for an invention (Japanese Unexamined Patent Publication No. 2002-018646) on a high frequency power amplifier circuit that outputs signals corresponding to demanded output power levels by fixing a gate bias voltage and controlling power voltages Vdd1 of amplifying stages FET Q1, Q2, and Q3, based on an output control voltage (output level specification signal Vramp). This system (called a power voltage control system), which is an open loop system, is poorer in control precision but has the advantage of reducing circuit size, in comparison with the closed loop system.

[Patent Publication 1]
Japanese Unexamined Patent Publication No. 2000-151310

SUMMARY OF THE INVENTION

The abovementioned closed loop system, which controls output power by controlling gate bias voltages by the APC circuit, is advantageous in that power efficiency is satisfactory regardless of whether an output level is low or high. However, there is a disadvantage with the closed loop system in that, since it requires a coupler and the APC circuit, the circuit size increases and packaging density decreases, and power losses occur in the coupler.

On the other hand, the high frequency power amplifier circuit of the abovementioned power voltage control system advantageously has high packaging density and low power losses because it requires no coupler. However, in the invention proposed previously, power voltages are supplied from a transistor for power voltage control common to the amplifying stages, and with a gate bias voltage fixed, the power voltages are changed to control output power.

As a result, the following problems have become apparent. That is, an attempt to increase power efficiency with a gate bias voltage kept low causes lack of output power in high regions of demanded output power, failing to obtain a desired output level. On the other hand, an attempt to obtain sufficient output power with a gate bias voltage kept high produces an excessive amount of current in low regions of demanded output power as shown by a broken line A in FIG. 11, reducing power efficiency. In FIG. 11, a solid line B indicates a relationship between current consumption Idd and output power Pout in a high frequency power amplifier circuit employing the gate bias control system.

An object of the present invention is to provide a high frequency power amplifier circuit and a radio communication system which have high packaging density and few power losses.

Another object of the present invention is to provide a high frequency power amplifier circuit and a radio communication system which can control output power by a power voltage and produce sufficient output power in high regions of demanded output power and improve power efficiency in low regions of demanded output power.

Another object of the present invention is to provide a high frequency power amplifier circuit and a radio communication system which can reduce current consumption and power losses and thereby prolong talk time and maximum standby time between battery charges.

The abovementioned and other objects and novel characteristics of the present invention will become apparent from the description of this specification and the accompanying drawings.

Briefly described below are the effects obtained by the representative examples of the invention disclosed in this application.

According to a first invention of this application, in a high frequency power amplifier circuit (RF power module) which comprises two or more cascaded FETs for amplification and controls output power by controlling power voltages of the FETs for amplification to gate terminals of which bias voltages of a predetermined level are applied, different transistors for power voltage control are provided for a last-stage FET for amplification and preceding-stage FETs for amplification. The transistors for power voltage control generate and apply a power voltage so that the preceding-stage FETs for amplification saturate when a demanded output level is relatively low. Herein, when the high frequency power amplifier circuit comprises three stages or more of the FETs for amplification, a different transistor for power voltage control may be provided for each of the stages, or a common transistor for power voltage control may be provided for the amplifying stages except the last stage.

According to the abovementioned means, even if gate bias voltage is fixed, control can be performed so that gains of preceding-stage FETs for amplification are higher than a gain of the last-stage FET for amplification in low regions of demanded output level, while, in high regions of demanded output level, a gain of the last-stage FET for amplification is higher than gains of preceding-stage FETs for amplification. By this arrangement, a high frequency power amplifier circuit is obtained which consumes a small amount of current and is excellent in power efficiency in low regions of demanded output level, and in high regions of demanded output level, does not cause lack of output power.

According to the abovementioned means, since the APC circuit for controlling gate bias voltages and a coupler are not required, a high frequency power amplifier circuit is obtained which has high packaging density and few power losses. Moreover, since a power voltage of the last-stage FET for amplification and a power voltage of the preceding-stage FETs for amplification can be controlled independently, the generation of a power voltage of the last-stage FET for amplification some time after the generation of power voltage of the preceding-stage FETs for amplification reduces the time of current flow though the last-stage FET for amplification consuming current most heavily, resulting in reduction in current consumption of the whole circuit.

According to a second invention of this application, in a high frequency power amplifier circuit (RF power module) constructed to control output power by applying a bias voltage of a predetermined level to gate terminals of two or more cascaded FETs for amplification, a transistor for power voltage control is provided in a drain side of a last-stage FET for amplification, and preceding-stage FETs for amplification are configured by a dual-gate FET or provided in the drain side thereof with second FETs connected in series. The transistor for power voltage control and the second FETs are controlled by an output level specification signal so as to be able to independently control drain voltages of the FETs for amplification of the different stages, and control is performed so that the preceding-stage FETs for amplification saturate when a demanded output level is relatively low.

By this arrangement, in low regions of demanded output level, a small amount of current flows through the last-stage FET for amplification, and in high regions of demanded output level, a sufficient amount of current flows through the last-stage FET for amplification. As a result, a high frequency power amplifier circuit is obtained which is excellent in power efficiency in low regions of demanded output level, and in high regions of demanded output level, does not cause lack of output power.

DESCRIPTION OF THE PREFERRED EMBODIMENTS

Hereinafter, embodiments of the present invention will be described in detail with reference to the drawings.

Figure 1:
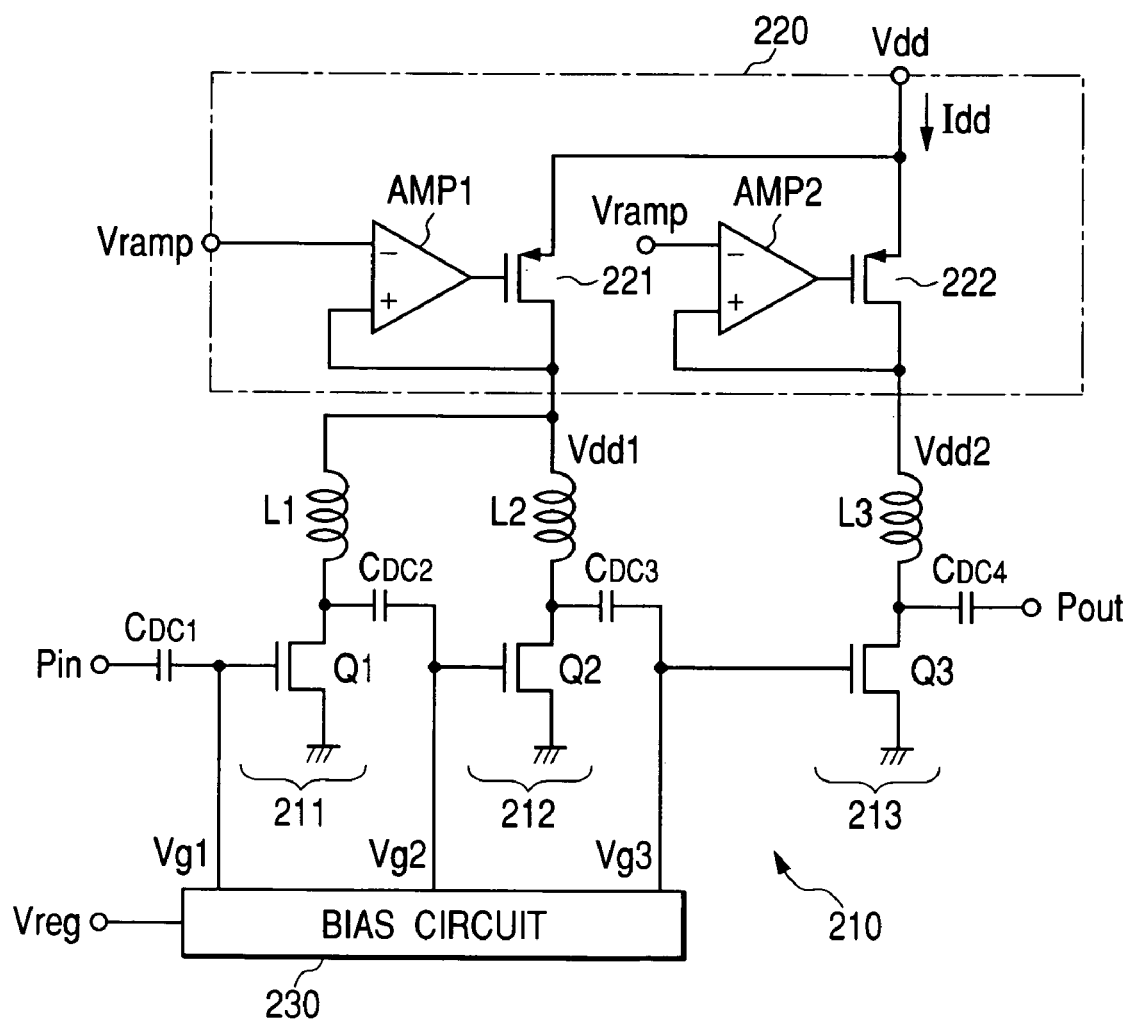
FIG. 1 is a diagram showing a configuration of a high frequency power amplifier circuit of a first embodiment according to the present invention.

FIG. 1 shows the outline configuration of a first embodiment of a high frequency power amplifier circuit according to the present invention. Though there is no particular limitation, a high frequency power amplifier circuit of this embodiment is formed as a module with plural semiconductor chips and discrete parts such as capacitances mounted on an insulating substrate such as a ceramic substrate.

The high frequency power amplifier circuit of the embodiment of FIG. 1 (RF power module) comprises a power amplifier 210 comprising three amplifying stages 211, 212, and 213, a power voltage control circuit 220 controlling a voltage applied to a power voltage terminal of the power amplifier 210, and a bias circuit 230 applying bias voltages Vg1, Vg2, and Vg3 to the amplifying stages 211, 212, and 213. The bias circuit 230 can be comprised of, for example, a resistive voltage divider that generates voltages Vg1, Vg2, and Vg3 by dividing a voltage Vreg supplied from a baseband circuit or the like (not shown in the figure) by a predetermined resistance ratio.

Each of the amplifying stages 211, 212, and 213 of the power amplifier 210 of this embodiment comprises field effect transistors Q1, Q2, and Q3 (hereinafter simply referred to as FET) such as MOSFET or GaAsMESFET. The power voltage control circuit 220 comprises: a transistor 221 for power voltage control, configured by a P-channel MOSFET, connected between a power voltage terminal Vdd and drain terminals of FETs Q1 and Q2 for amplification of the first and second amplifying stages 211 and 212; an operational amplifier AMP1 (differential amplifier) connected with a gate terminal of the transistor 221; a transistor 222 for power voltage control, configured by a P-channel MOSFET, connected between a power voltage terminal Vdd and a drain terminal of FET Q3 for amplification of the third amplifying stage 213; and an operational amplifier AMP2 connected with a gate terminal of the transistor 222.

The operational amplifiers AMP1 and AMP2 respectively have inversion input terminals to which an output level specification signal Vramp is inputted. The output level specification signal Vramp indicates an output control voltage specifying an output level that is supplied from a baseband circuit (not shown in the figure) or the like. The inversion input terminals are respectively fed back with drain voltages of the corresponding transistors 221 and 222 for power voltage control. As a result, secondary power voltages Vdd1 and Vdd2 having the same level as the output level specification signal Vrmp are applied to the drain terminals of the FETs Q1, Q2, and Q3 of the amplifying stages 211, 212, and 213 from the transistors 221 and 222 for power voltage control.

Though there is no particular limitation, FETs Q1, Q2, and Q3 of the amplifying stages 211, 212, and 213 are designed to have an element size (gate width) ratio of, e.g., 1:3:9 when used in the GSM system, and an element size ratio of. e.g., 1:3:12 when used in a DCS (Digital Cellular System) system. The gate terminals of the FETs Q1, Q2, and Q3 of the amplifying stages 211, 212, and 212 are applied with bias voltages Vg1, Vg2, and Vg3 of 1, 1.3, and 1.6 V, respectively.

Figure 10:
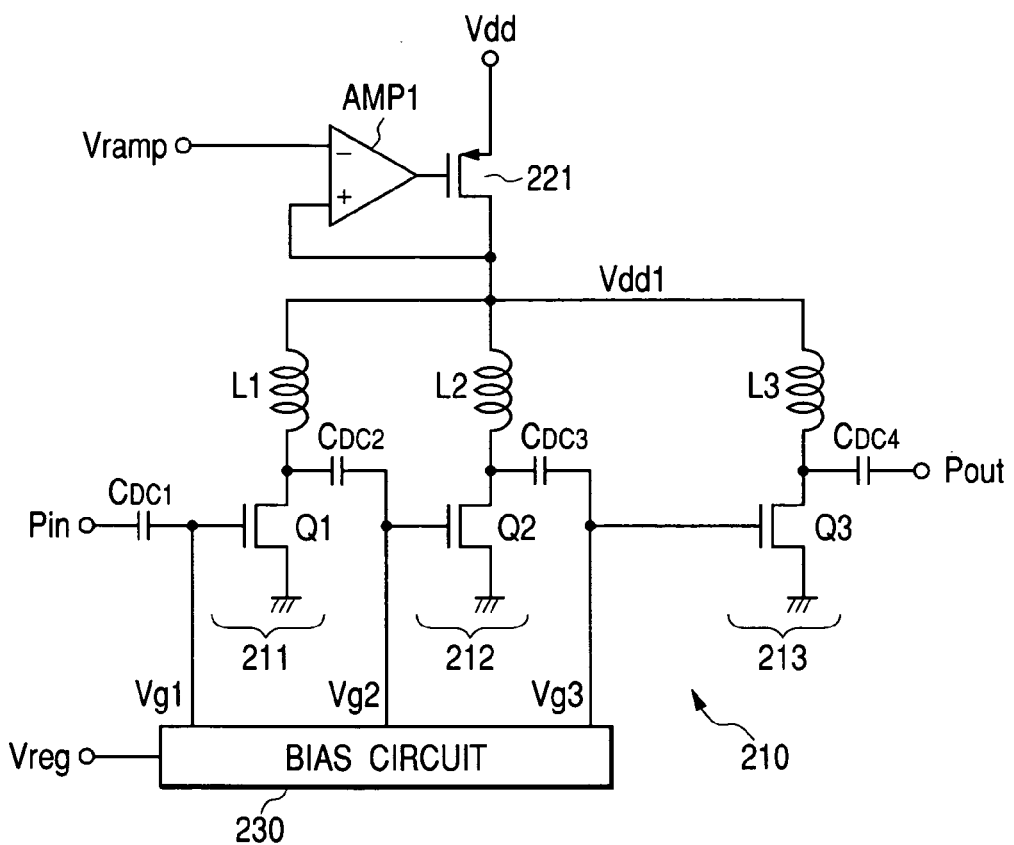
FIG. 10 is a graph showing a high frequency power amplifier circuit of the power voltage control system studied prior to the present invention.
Figure 11:
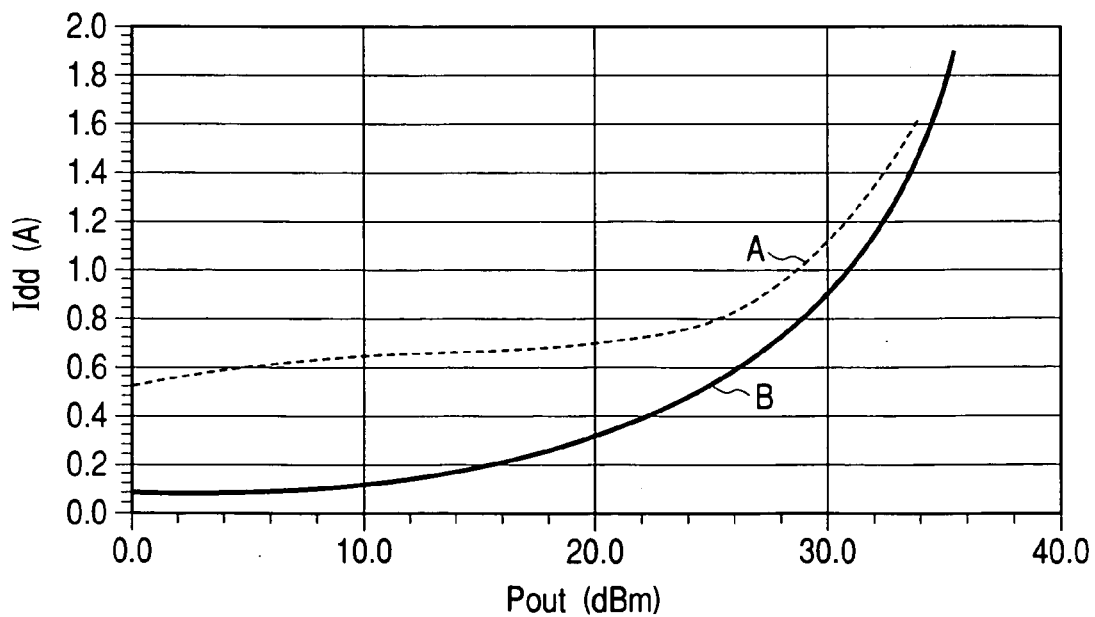
FIG. 11 is a graph showing a relationship between output power Pout and current consumption Idd in a high frequency power amplifier circuit of the power voltage control system studied prior to the present invention and a high frequency power amplifier circuit of a gate bias control system.

By this construction, the first-stage and the second-stage FETs Q1 and Q2 for amplification are controlled so that drain currents saturate at a relatively small level of the level specification signal Vramp. The third-stage FET Q3 for amplification is controlled so that a drain current changes relatively linearly over the entire range of the output level specification signal Vramp. As a result, in a high frequency power amplifier circuit that has a common secondary power voltage Vdd1 among the amplifying stages as shown in FIG. 10, the third-stage FET Q3 for amplification has occupied a high ratio of output power in relatively low regions of the output level specification signal Vramp as shown in FIG. 3, causing reduction in power efficiency, while, in a high frequency power amplifier circuit of this embodiment, as shown in FIG. 4, the third-stage FET Q3 for amplification occupies a smaller ratio of output power in relatively low regions of the output level specification signal Vramp, resulting in improved power efficiency.

Figure 3:
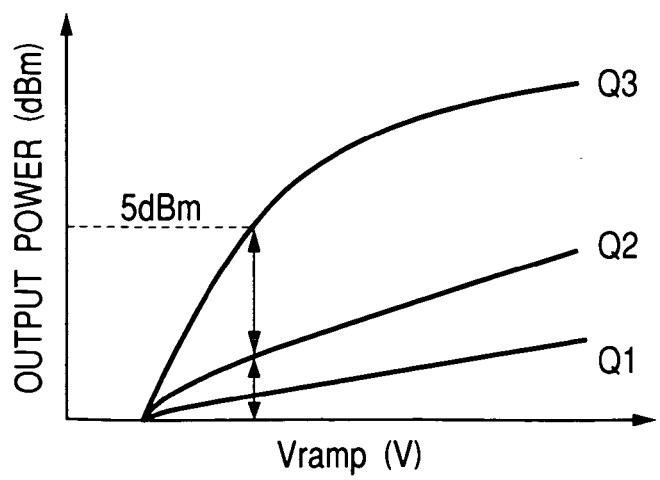
FIG. 3 is a graph showing a relationship between output control voltages Vramp and output power Pout in a high frequency power amplifier circuit of a power voltage control system studied prior to the present invention.
Figure 4:
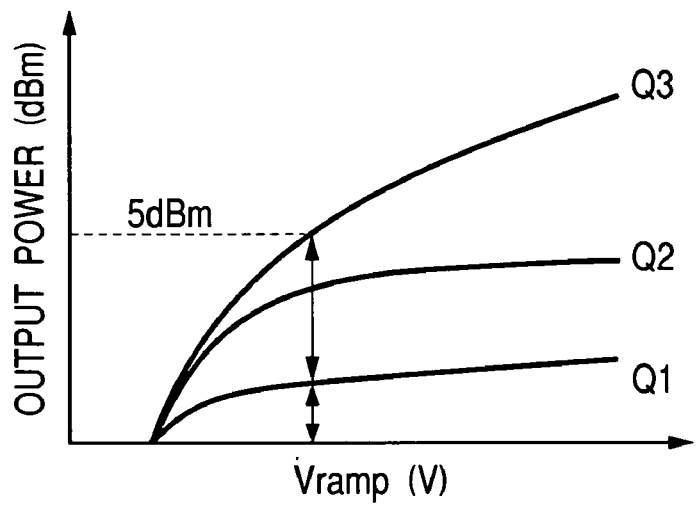
FIG. 4 is a graph showing a relationship between output control voltages Vramp and output power Pout in an embodied high frequency power amplifier circuit.
Figure 5:
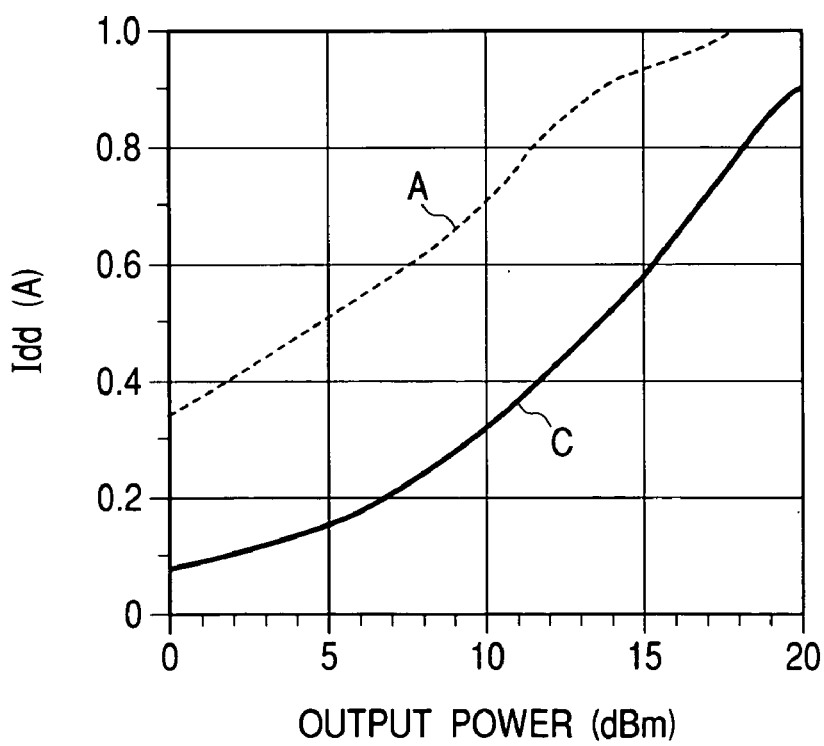
FIG. 5 is a graph showing a relationship between output power Pout and current consumption Idd in the embodied high frequency power amplifier circuit.

According to a simulation made by the inventors, in a high frequency power amplifier circuit in which the output power of the amplifying stages is controlled at a ratio as shown in FIG. 3, a relatively large amount of a total drain current Idd flows as shown by a broken line A in FIG. 5. On the other hand, in the high frequency power amplifier circuit of this embodiment in which the output power of the amplifying stages is controlled at a ratio as shown in FIG. 4 (FIG. 1), a relatively small amount of the total drain current (Idd) flows as shown by a solid line C in FIG. 5.

As seen from FIG. 5, by applying this embodiment, current consumption of the high frequency power amplifier circuit can be significantly reduced in regions where output power Pout is low. In a radio communication system such as a cellular phone, transmission at locations near a base station in a state of low output power Pout is made more frequently than transmission at locations distant from the base station in a state of high output power. Therefore, it is a very great merit that current consumption of the high frequency power amplifier circuit can be significantly reduced in regions where output power Pout is low.

The power voltage control circuit 220 is not limited to the one that comprises the transistors 221 and 222 for power voltage control, and the operational amplifiers AMP1 and AMP2. With the operational amplifiers omitted, the power voltage control circuit 220 may comprise only MOS transistors or bipolar transistors to the control terminal (gate terminal or base terminal) of which the output level specification signal Vramp is directly applied. In FIG. 1, the transistor 221 for power voltage control is provided which is common to the first-stage and the second-stage FETs Q1 and Q2 for amplification. However, different transistors for power voltage control for the FETs Q1 and Q2, and different operational amplifiers for driving them may be provided.

Moreover, in the case where the operational amplifiers AMP1 and AMP2 are used, a phase compensation circuit comprising series resistors and capacitances may be provided between the output terminals and an internal node. Also, resistors may be respectively connected between the drain or collector of the transistors 221 and 222 for power voltage control and the non-inversion input terminals of the operational amplifiers AMP1 and AMP2, and between the non-inversion input terminals of the operational amplifiers AMP1 and AMP2 and a ground point, whereby secondary power voltages Vdd1 and Vdd2 are generated according to a ratio of the resistors and an output control voltage Vramp and supplied to the drains of the FETs Q1, Q2, and Q3 for amplification.

In FIG. 1, L1 to L3 respectively designate inductance elements for matching impedance to the power control circuit 220, and CDC1 to CDC4 designate capacitative elements that cut off DC components. When the high frequency power amplifier circuit of the embodiment is a RF power module, the inductances L1 to L3 may comprise micro strip lines and the like formed on an insulating substrate such as ceramic or the like. Though the capacitative elements CDC1 to CDC4 cutting off DC components may be configured by discrete parts, if an insulating substrate with plural dielectric layers stacked on top of one another is used, a capacitance may be used in which conductive layers are formed, as electrodes, so as to face each other on the surface and back of one of the dielectric layers.

Another embodiment of the present invention will be described.

Figure 2:
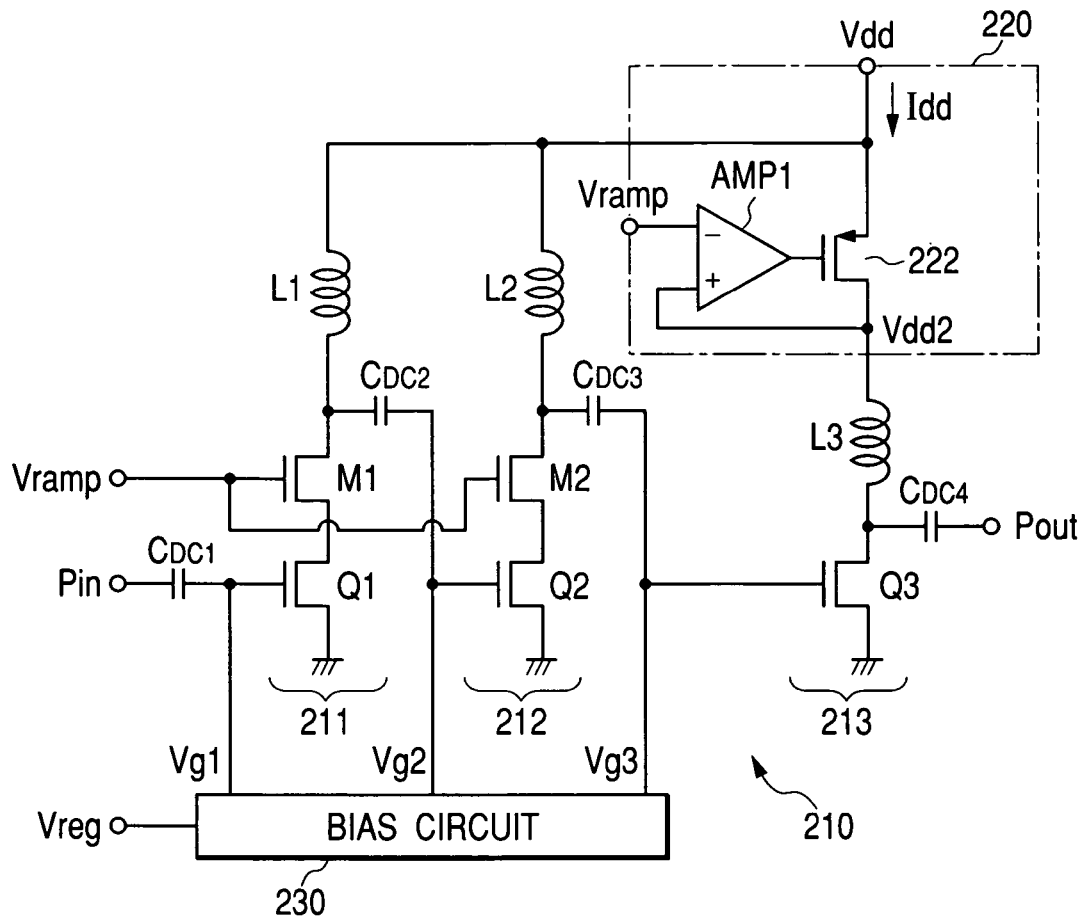
FIG. 2 is a diagram showing a configuration of a high frequency power amplifier circuit of a second embodiment according to the present invention.

FIG. 2 shows a second embodiment of a high frequency power amplifier circuit to which the present invention is applied. In a power amplifier 210 of the high frequency power amplifier circuit of this embodiment, first and second amplifying stages 211 and 212 of three amplifying stages 211, 212, and 213 respectively comprise FETs Q1 and Q2 for amplification and MOSFETs M1 and M2 connected in series with the FETs, an output level specification signal Vramp being applied to gate terminals of the MOSFETs M1 and M2. The three-stage amplifying stage 213 comprises only an FET Q3 for amplification.

The power voltage control circuit 220, provided with only the third amplifying stage 213, comprises a transistor 222 for power voltage control, configured by a P-channel MOSFET, connected between a power voltage terminal Vdd and a drain terminal of a FET Q3 for amplification of the third amplifying stage 213, and an operational amplifier AMP2 connected to a gate terminal of the transistor 222.

FETs Q1, Q2, and Q3 of the amplifying stages 211, 212, and 213 are designed to have an element size (gate width) ratio of, e.g., 1:3:9 when used in the GSM system, and an element size ratio of. e.g., 1:3:12 when used in the DCS system. The gate terminals of the FETs Q1, Q2, and Q3 of the amplifying stages 211, 212, and 212 are applied with bias voltages Vg1, Vg2, and Vg3 of 1, 1.3, and 1.6 V, respectively.

Figure 6:
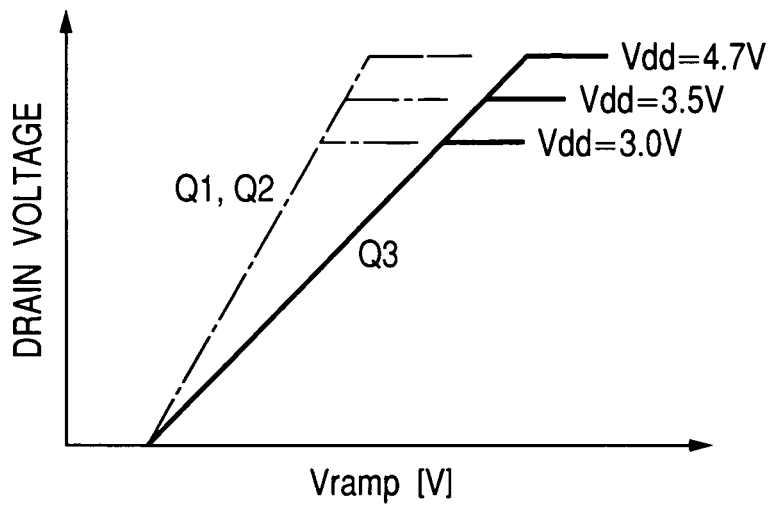
FIG. 6 is a graph showing a relationship between output control voltage Vramp and drain voltages of amplifying stages FET in the high frequency power amplifier circuit of a second embodiment.

By this construction, in this embodiment, constants of the elements are set so that drain voltages of FETs Q1, Q2, and Q3 of the amplifying stages 211, 212, and 213 change almost linearly according to the output level specification signal Vramp as shown in FIG. 6, and drain voltages of the FET Q1 and Q2 shown by a broken line in FIG. 6 change more steeply than a drain voltage of the FET Q3 shown by a solid line in FIG. 6.

Therefore, like the first embodiment, the first-stage and the second-stage FETs Q1 and Q2 for amplification are controlled so that drain currents saturate at a relatively small level of the level specification signal Vramp. The third-stage FET Q3 for amplification is controlled so that a drain current changes relatively linearly over the entire range of the output level specification signal Vramp. As a result, as shown in FIG. 4, the third-stage FET Q3 for amplification occupies a smaller ratio of output power in relatively low regions of the output level specification signal Vramp, resulting in improved power efficiency.

Also in the second embodiment (FIG. 2), with the operational amplifier AMP2 omitted, the power voltage control circuit 220 may comprise only MOS transistors or bipolar transistors to the control terminal (gate terminal or base terminal) of which the output level specification signal Vramp is directly applied. In the case where the operational amplifier AMP2 is used, a phase compensation circuit comprising series resistors and capacitances may be provided between its output terminal and an internal node. Also, resistors may be respectively connected between the drain or collector of the transistor 222 for power voltage control and the non-inversion input terminal of the operational amplifier AMP2, and between the non-inversion input terminal of the operational amplifier AMP2 and a ground point, whereby a secondary power voltage Vdd2 is generated according to a ratio of the resistances and an output control voltage Vramp and supplied to the drain of the FET Q3 for amplification.

In the embodiment of FIG. 2, the first and second amplifying stages 211 and 212 respectively comprise the FETs Q1 and Q2 for amplification and the MOSFETs M1 and M2 connected in series with the FETs, the output level specification signal Vramp being applied to gate terminals of the MOSFETs M1 and M2. However, instead of disposing the MOSFETs M1 and M2 connected in series, a dual-gate FET is used as the FETs Q1 and Q2 for amplification. Then, bias voltages Vg1 and Vg2 may be applied to a first gate (a gate of the ground side) of the dual-gate FET and an input high frequency signal Pin may be inputted to apply the output level specification signal Vramp to a second gate (a gate of the power voltage side). The dual-gate FET refers to a field effect transistor in which two gate electrodes are disposed side by side between a drain region and a source region along a channel direction, correspondingly to one channel region.

Moreover, the high frequency power amplifier circuit of the embodiment of FIG. 2 can be configured as one semiconductor integrated circuit or module. The high frequency power amplifier circuit may be preferably configured as a module as follows, for example. Thai is, the FETs Q1 and Q2 of the first and second amplifying stages 211 and 212, MOSFETs M1 and M2 connected in series with the FETs, an operational amplifier AMP2 making up the power voltage control circuit 220, and the bias circuit 230 are formed as one semiconductor integrated circuit. Moreover, the FET Q3 of the third amplifying stage 213 and the transistor 222 for the power voltage on the drain side are configured using discrete transistor elements because a relatively large current flows through them.

The inductances L1 to L3 may comprise micro strip lines and the like formed on an insulating substrate such as ceramic or the like. The capacitative elements CDC1 and CDC2 cutting off DC components may be configured by discrete parts, or capacitances in which conductive layers are formed, as electrodes, so as to face each other on the surface and back of dielectric layers of a stacked insulating substrate.

Figure 7:
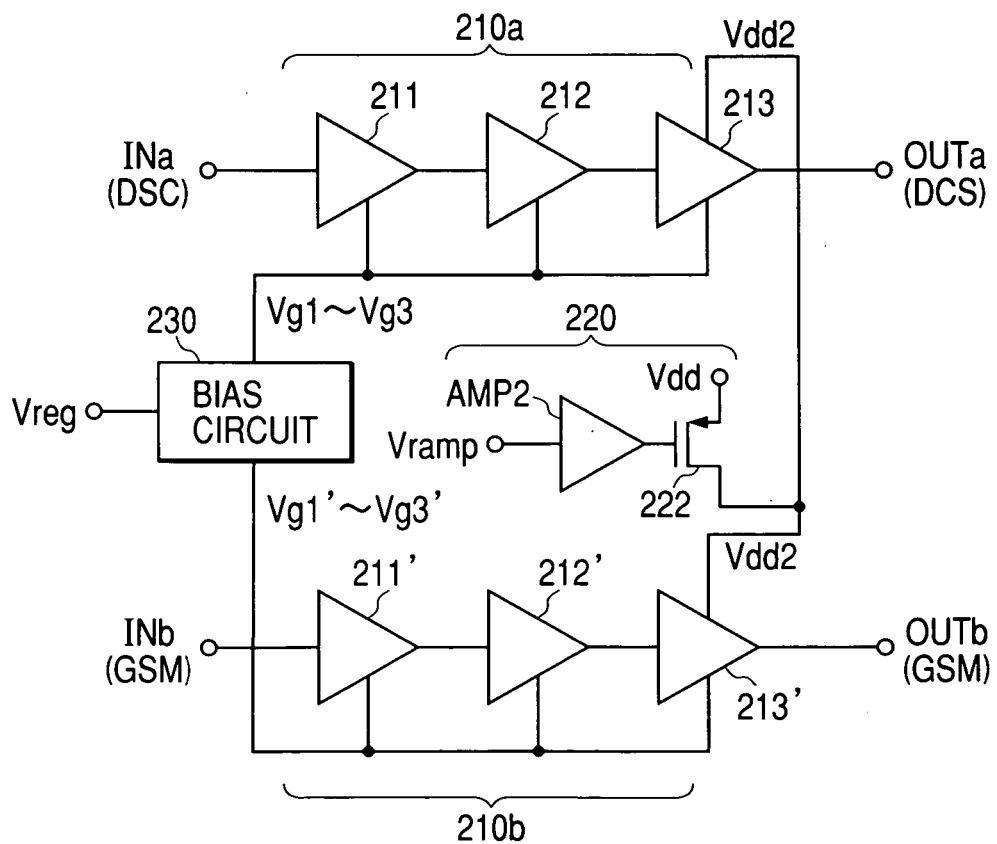
FIG. 7 is a schematic circuit diagram showing an embodiment of a high frequency power amplifier circuit capable of amplifying power of transmission signals by the two systems GSM and DCS.

Moreover, if an RF power module is provided which includes two power amplifiers 210 so that both a GSM transmission signal and a DCS transmission signal can be amplified for output, the power voltage control circuit 220 and the bias circuit 230 may be respectively configured as circuits common to the two power amplifiers 210 of GSM and DCS. FIG. 7 shows an example of such a configuration.

In FIG. 7, 210a designates a power amplifier that amplifies a DCS transmission signal, and 210b designates a power amplifier that amplifies a GSM transmission signal. A bias circuit 230 is disposed as a circuit common to two power amplifiers 210a and 210b. However, since maximum output electric power is different between GSM and DCS gate bias voltages Vg1 to Vg3 to the amplifying stages 211 to 213 of the power amplifier 210a are not identical with gate bias voltages Vg1' to Vg3' to the amplifying stages 211' to 213' of the power amplifier 210b. Voltages suitable to amplify signals of the respective bands to desired output power may be applied.

For convenience of illustration, FIG. 7 shows only a transistor 222 for power voltage control that supplies power voltage Vdd2 to the third amplifying stages 213 and 213', and an amplifier AMP2 that drives it. However, in the case where the first embodiment is applied, similarly, a transistor 221 for power voltage control that supplies power voltage Vdd1 to the first and second amplifying stages 211, 211', 212, and 212', and an amplifier AMP1 that drives them may be disposed as common circuits.

In case of the module of the embodiment of FIG. 7, the two power amplifiers 210a and 210b, the bias circuit 230, and the power voltage control circuit 220 may be formed as one semiconductor integrated circuit. However, of the bias circuit 230 and the power voltage control circuit 220, the operational amplifier AMP2 and the first-stage and second-stage FETs Q1 and Q2 for amplification of the two power amplifiers 210a and 210b, and the MOSFETs M1 and M2 connected in series with the FETs may be formed as one semiconductor integrated circuit. Moreover, independent discrete parts may be used for the two third-stage FETs Q3, and the transistor 222 for power voltage control common to Q1 and Q2, respectively.

Figure 8:
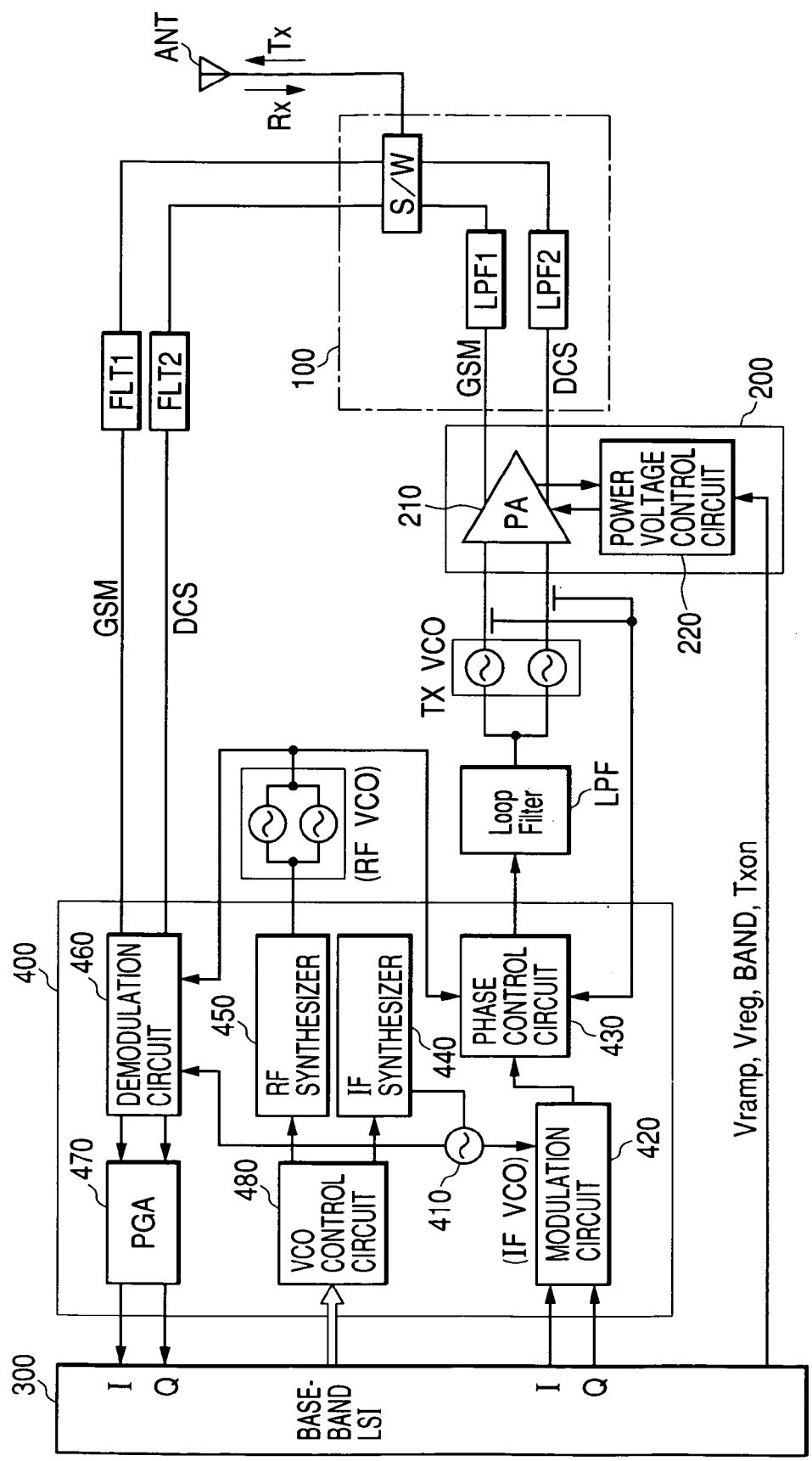
FIG. 8 is a block diagram showing a configuration of a cellular phone system capable of transmission and reception by the two systems GSM and DCS that uses a high frequency power amplifier circuit of an embodiment of FIG. 7.

FIG. 8 shows a configuration of a cellular phone system capable of transmission and reception by use of the high frequency power amplifier circuit of the embodiment in the two systems GSM and DCS.

In FIG. 8, ANT designates an antenna for transmitting and receiving a signal wave; 100, a front end module; 200, an RF power module of the abovementioned embodiment; 300, a baseband LSI that converts an audio signal into a baseband signal, converts a received signal into an audio signal, and generates a band switching signal; 400, an IC for modulation and demodulation that down-converts a received signal for demodulation to generate a baseband signal, and modulates a transmission signal; TXVCO, an oscillator for transmission; LPF, a loop filter of a sending side; FLT1 and FLT2, filters that remove noises and interfering waves from a received signal of GSM and DCS; and RFVCO, an RF oscillator that generates an oscillation signal common to transmission and reception.

The front end module 100 comprises low path filters LPF1 and LPF2 that remove harmonic components from a transmission signal of GSM and DCS outputted from the RF power module 200 respectively, and a switch SW for switching between transmission and reception. Though not shown, the front end module 100 is also provided with an impedance matching circuit that is connected with an transmission output terminal of the RF power module 200 to match impedance to an antenna end.

The baseband LSI 300 can be configured with an LSI incorporating a DSP (Digital Signal Processor), a microprocessor, a memory, and the like. The cellular phone system of this embodiment is configured so that an output level specification signal Vramp to the RF power module 200, bias control voltage Vreg, a band specification signal BAND indicating GSM or DCS, and a transmission control signal Txon are supplied from the baseband LSI 300.

The IC 400 for modulation and demodulation comprises: IFVCO 410 that generates an oscillation signal of intermediate frequency; a modulation circuit 420 that performs quadrature modulation by synthesizing oscillation signals 90 degrees out of phase with each other, supplied from the IFVCO 410, and transmission signals I and Q supplied from the baseband LSI 300; a phase control circuit 430 that detects a phase difference between a signal from the modulation circuit 420 and an output signal of an oscillator TXVCO for transmission to control phases; an IF synthesizer 440 that makes up a PLL circuit in conjunction with the IFVCO 410; an RF synthesizer 450 that makes up the PLL circuit in conjunction with RFVCO; a demodulation circuit 460 that performs a down-convert operation by synthesizing a received signal and a high frequency signal from the RFVCO, and performs quadrature demodulation by synthesizing the down-converted received signal and an oscillation signal from the IFVCO 410; a high-gain amplifier circuits (PGA) 470 that amplifies demodulated I and the Q signals to a predetermined level and sends the amplified signals to the baseband LSI; and a VCO control circuit 480 that performs control such as VCO activation and halt, and correction of dispersion of oscillation frequencies.

In the system of FIG. 8, the output level specification signal Vramp is supplied from the baseband LSI 300 to the RF power module 200. However, the system may be configured so as to supply the output level specification signal Vramp from the IC 400 for modulation and demodulation to the RF power module 200. Also, the baseband LSI 300 and the IC 400 for modulation and demodulation may be configured as one semiconductor integrated circuit.

Figure 9:
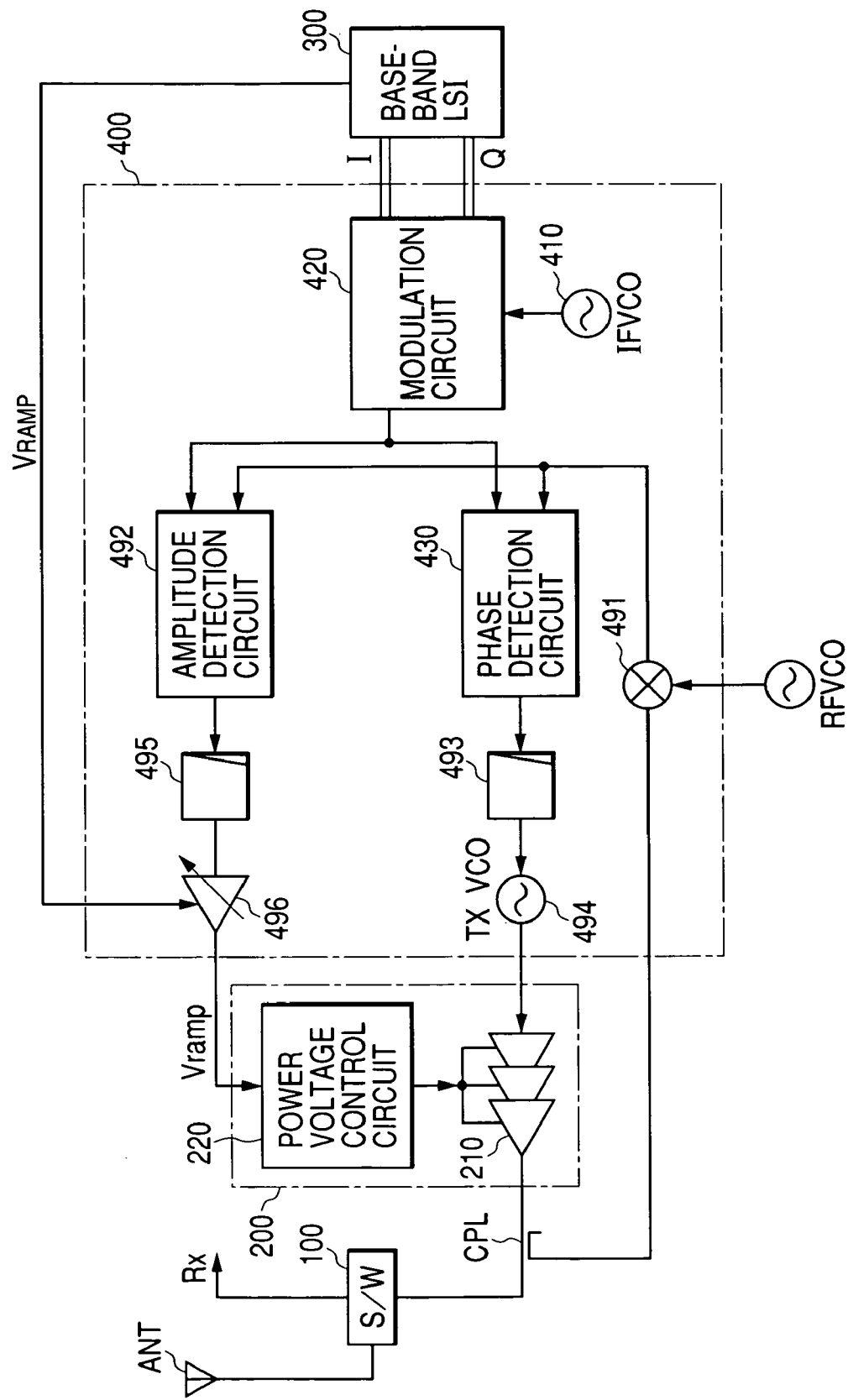
FIG. 9 is a block diagram showing a configuration of a cellular phone system capable of transmission and reception by the EDGE system that uses an embodied high frequency power amplifier circuit.

FIG. 9 shows a structure of a system in which the RF power module of the abovementioned embodiment is applied to a cellular phone system supporting communication of the EDGE (Enhanced Data Rates for GMS Evolution) system. The EDGE system has a dual-mode communication function by which audio signal communications are performed by GMSK (Gaussian Minimum Shift Keying) modulation, and data communications are performed by 3π/8rotating8-PSK (Phase Shift Keying) modulation. The system in FIG. 9 employs a polar-loop communication system in which a transmission signal is divided into a phase component and an amplitude component and which performs control by a phase control loop and an amplitude control loop provided correspondingly to them.

In FIG. 9, ANT designates an antenna for transmitting and receiving signal waves; 100, a front end module that comprises a low path filter for removing harmonic components from transmission signals, a switch for switching between transmission and reception, and the like; 200, an RF power module of the abovementioned embodiment; 300, a baseband LSI that converts an audio signal into a baseband signal, converts a received signal into an audio signal, and generates a band switching signal; 400, an IC for modulation and demodulation that down-converts a received signal for demodulation to generate a baseband signal, and modulates a transmission signal; and CPL, a coupler that detects an output signal of the power amplifier 210.

The IC 400 for modulation and demodulation comprises: IFVCO 410 that generates an oscillation signal of intermediate frequency; a modulation circuit 420 that performs quadrature modulation by synthesizing oscillation signals 90 degrees out of phase with each other, supplied from the IFVCO 410, and transmission signals I and Q supplied from the baseband LSI 300; a mixer 491 that performs a down-convert operation by synthesizing a signal detected by the coupler and a signal from the RFVCO; a phase detection circuit 430 that detects a phase difference between a signal down-converted by the mixer 491 and a signal from the modulation circuit 420; an amplitude detection circuit 492 that detects an amplitude difference between a signal down-converted by the mixer 491 and a signal from the modulation circuit 420; a phase loop filter 493 that integrates the output of the phase detection circuit 430; an oscillator for transmission (TXVCO) 494 that oscillates at a frequency corresponding to the output of the filter 493; an amplitude loop filter 495 that integrates the output of the amplitude detection circuit 492; a variable gain amplifier 496 that amplifies the output of the loop filter 495 according to a gain corresponding to the output level specification signal VRAMP from the baseband LSI 300; and the like.

The output of the variable gain amplifier 496 is supplied to the power voltage control circuit 220 within the power module 200 of the abovementioned embodiment as a power voltage control signal Vramp. Though not shown in FIG. 9, the IC 400 for modulation and demodulation is also provided with the following receiving circuits: a mixer that performs a down-convert. operation by synthesizing a received signal and an oscillation signal from the RFVCO; a high-gain amplifier circuit (PGA) that amplifies a down-converted received signal Rx to a signal of a predetermined level and sends the amplified signal to the base band LSI 300; and the like.

Hereinbefore, though the invention made by the inventors of the present invention has been described in detail based on the preferred embodiments, it goes without saying that the present invention is not to be limited in any way to the examples of the preferred embodiment, and may be modified in various ways without changing the main purports of the present invention. For example, instead of the P-channel MOSFETs used as the transistors 221 and 222 for power voltage control in the abovementioned embodiments, PNP bipolar transistors may be employed. In this case, preferably, the abovementioned PNP transistors may be configured by transistors in which collector-to-emitter voltage Vcc in a saturation state has a small value (Vsat). By this construction, the collector voltages (secondary power voltages Vdd1 and Vdd2) can be controlled up to a level close to a primary voltage Vdd.

Though the high frequency power amplifier circuit of the abovementioned embodiments includes amplification transistors connected in three stages, amplification transistors of two stages or four stages or more may be employed. Though the amplification transistor Q3 of the last stage in the abovementioned embodiment is formed on a chip separate from that of the bias circuit, it may be formed on the same chip as that of the bias circuit like the other amplification transistors Q1 and Q2.

Moreover, in the abovementioned embodiment (FIG. 8), a description has been made of a high frequency power amplifier circuit supporting communication of the GSM system and the DCS system. However, besides the two systems, the present invention can apply to high frequency power amplifier circuits of the triple band system capable of handling PCS (Personal Communication System) signals of 1850 to 1915 MHz band. In this case, since DCS and PCS are relatively close in frequency bands, PCS signals may be inputted to the same input terminal as for DCS signals, amplified by a common high frequency power amplifier circuit, and then outputted from a common output terminal.

Briefly described below are the effects obtained by the representative examples of the invention disclosed in this application.

Specifically, according to the present invention, a high frequency power amplifier circuit is obtained which consumes a small amount of current and is excellent in power efficiency in low regions of demanded output level, and in high regions of demanded output level, does not cause lack of output power. Moreover, since no coupler is required, a high frequency power amplifier circuit with high packaging density and few power losses is obtained. As a result, in radio communication systems such as cellular phones using the high frequency power amplifier circuit, talk time and maximum standby time between battery charges can be prolonged.

What is claimed is:

1. A high frequency power amplifier circuit, comprising:
a plurality of amplifying stages which are coupled in cascade between an input terminal and an output terminal for amplification, each of the amplifying stage including a field effect transistor as an amplifier;
a bias circuit which supplies bias voltages set to predetermined values to control terminals of the plurality of amplifying stages; and
a power source voltage control circuit which is coupled between a power source voltage and the amplifying stages, receives the power source voltage, and generates a first power voltage for a final one of said amplifying stages, said final amplifying stage being nearest to the output terminal and generates a second power voltage for preceding ones of said amplifying stages in accordance with an output power specification signal,
wherein the power source voltage control circuit includes a first control transistor for controlling the first power voltage and a second control transistor which is different form the first control transistor for controlling the second power voltage, and
wherein the power source voltage control circuit set the second power voltage to determine a current flow on said preceding amplifying stages in a saturate state, when the first power voltage is set to determine a current flow on the final stage in a linear state.

2. A high frequency power amplifier circuit according to claim 1, wherein the power source voltage control circuit further includes a first differential circuit which receives the output power specification signal and the first power voltage and supplies a first control voltage to the first control transistor, and a second differential circuit which receives the output power specification signal and the second power voltage and supplies a second control voltage to the second control transistor.

3. A high frequency power amplifier circuit according to claim 1,
wherein gate widths of the field effect transistors as amplifiers included in the amplifying stages increase in order from one of the amplifying stages nearest to the input terminal to the final amplifying stage such that the current flows on said preceding amplifying stages in the saturate state, when the current flows on the final stage in the linear state.

4. A high frequency power amplifier circuit according to claim 1,
wherein the bias voltages increase in order from one of the amplifying stages nearest to the input terminal to the final amplifying stage such that the current flows on the preceding amplifying stages in the saturate state, when the current flows on the final stage in the linear state.

5. A high frequency power amplifier circuit, comprising:
a first amplifying stage having a first amplifier transistor which receives an input signal to be amplified and a power source voltage, and a first control transistor which receives an output power specification signal and is connected the first amplifying stage in series;
a second amplifying stage having a second amplifier transistor which receives an output of the first amplifying stage and the power source voltage, and a second control transistor which receives the output power specification signal;
a third amplifying stage having a third amplifier transistor which receives an output of the second amplifying stage and outputs an output signal amplified by the third amplifying stage;
a bias circuit which supplies bias voltages set to predetermined values to input terminals of the first, second and third amplifying stages; and
a power source voltage control circuit which is coupled between the power source voltage and the third amplifying stage, receives the power source voltage, and generates a power voltage for the third amplifying stage in accordance with the output power specification signal,
wherein the power source voltage control circuit includes a power source control transistor for controlling the first power voltage, and
wherein the power source voltage control circuit set the power voltage to determine a current flow on the third stage in a linear state, when a current flow on the first and the second amplifying stages in a saturate state.

6. A high frequency power amplifier circuit according to claim 5, wherein the first amplifier transistor and the first control transistor form a first dual gate field effect transistor, and wherein the second amplifier transistor and the second control transistor form a second dual gate field effect transistor.

7. A high frequency power amplifier circuit according to claim 6, wherein the power source voltage control circuit further includes a differential circuit which receives the output power specification signal and the power voltage, and supplies a control voltage to the power source control transistor.

8. A high frequency power amplifier circuit according to claim 5, wherein gate widths of the field effect transistors as amplifiers included in the amplifying stages increase in order from the first amplifier stage, the second amplifier stage, to the third amplifier stage for the current flows on the first and the second amplifying stages in the saturate state, when the current flows on the third stage in the linear state.

9. A high frequency power amplifier circuit according to claim 5, wherein the bias voltage increase in order from the first amplifier stage, the second amplifier stage, to the third amplifier stage for the current flows on the first and the second amplifying stages in the saturate state, when the current flows on the third stage in the linear state.

10. A radio communication system comprising:

a first high frequency power amplifier circuit for amplifying a first frequency band, said first high frequency power amplifier circuit including a plurality of amplifying stages coupled in cascade;

a second high frequency power amplifier circuit for amplifying a second frequency band, said second high frequency power amplifier circuit including a plurality of amplifying stages coupled in cascade;

a baseband circuit which converts an audio signal into a baseband signal to be transmitted and converts a received signal into the audio signal;

a power source voltage control circuit which is coupled between a power source voltage, a final amplifying stage of the plurality of amplifying stages of the first high frequency power amplifier circuit, and a final amplifying stage of the plurality of amplifying stages of the second high frequency power amplifier circuit, receives the power source voltage, and generates a power voltage for the final amplifying stage of the first high frequency power amplifier circuit and for the final amplifying stage of the second high frequency power amplifier circuit in accordance with an output power specification signal; and a modulation/demodulation circuit which demodulates the received signal and modulates the baseband signal, wherein each of the first and second high frequency power amplifier circuits includes a first amplifying stage having a first amplifier transistor which receives an input signal to be amplified and a power source voltage, and a first control transistor which receives an output power specification signal and is connected the first amplifying stage in series; a second amplifying stage having a second amplifier transistor which receives an output of the first amplifying stage and the power source voltage, and a second control transistor which receives the output power specification signal; a third amplifying stage having a third amplifier transistor which receives an output of the second amplifying stage and outputs an output signal amplified by the third amplifying stage; a bias circuit which supplies bias voltages set to predetermined values to input terminals of the first, second and third amplifying stages; and a power source voltage control circuit which is coupled between the power source voltage and the third amplifying stage, receives the power source voltage, and generates a power voltage for the third amplifying stage in accordance with an output power specification signal, the power source voltage control circuit includes a power source control transistor for controlling the first power voltage, and the power source voltage control circuit set the power voltages to determine a current flow on the third stage in a liner state, when a current flow on the first and the second amplifying stages in a saturate state, wherein the first high frequency power amplifier circuit amplifies the baseband signal and outputs a first transmission signal of the first frequency band, wherein the second high frequency power amplifier circuit amplifies the baseband signal and outputs a second transmission signal of the second frequency band, and wherein a power source control transistor for controlling the power voltage is included in the power source voltage control circuit and arranged in common for the final amplifying stages of the first and second high frequency power amplifier circuits.

* * * * *